(12) United States Patent
Gu et al.

(10) Patent No.: US 10,923,508 B2
(45) Date of Patent: Feb. 16, 2021

(54) ARRAY SUBSTRATE AND MANUFACTURING METHOD THEREFOR, DISPLAY PANEL, AND DISPLAY DEVICE

(71) Applicant: BOE Technology Group Co., Ltd., Beijing (CN)

(72) Inventors: Renquan Gu, Beijing (CN); Qi Yao, Beijing (CN); Wusheng Li, Beijing (CN); Dongsheng Li, Beijing (CN); Huili Wu, Beijing (CN); Shipei Li, Beijing (CN); Dongsheng Yin, Beijing (CN); Fang He, Beijing (CN); Yang Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 16/398,488

(22) Filed: Apr. 30, 2019

(65) Prior Publication Data
US 2020/0105790 A1    Apr. 2, 2020

(30) Foreign Application Priority Data

Sep. 29, 2018 (CN) .......................... 201811149702.0

(51) Int. Cl.
*H01L 27/12* (2006.01)
*H01L 23/48* (2006.01)
(Continued)

(52) U.S. Cl.
CPC .......... *H01L 27/124* (2013.01); *H01L 23/481* (2013.01); *H01L 23/482* (2013.01);
(Continued)

(58) Field of Classification Search
CPC . H01L 23/481; H01L 23/482; H01L 23/5226; H01L 33/382; H01L 33/387; H01L 27/124

See application file for complete search history.

(56) References Cited

U.S. PATENT DOCUMENTS 10,115,744 B2 * 10/2018 Li ........................ H01L 27/1244
2007/0200134 A1 * 8/2007 Therrien ............... H01L 23/481
257/103
(Continued)

FOREIGN PATENT DOCUMENTS

CN         104282769 A      1/2015
CN         105742296 A      4/2016
(Continued)

OTHER PUBLICATIONS

Chinese Office Action for corresponding application 201811149702.0 dated Mar. 25, 2020.

*Primary Examiner* — Matthew E Warren
(74) *Attorney, Agent, or Firm* — Arent Fox LLP; Michael Fainberg

(57) ABSTRACT

The disclosure relates to an array substrate and a manufacturing method therefor, a display panel, and a display device. The array substrate comprises a base substrate, and a lead-out line and an inorganic insulating layer which are located on one side of the base substrate; the base substrate is provided with a plurality of connection vias penetrating the base substrate and filled with a first conductive material; the inorganic insulating layer is provided with a first via and a second via, the first via penetrating to the first conductive material, and the second via penetrating to the lead-out line; a second conductive layer is disposed on the side, away from the base substrate, of the first via, the second via and the inorganic insulating layer, such that the first conductive
(Continued)

material and the lead-out line are electrically connected through the second conductive layer.

15 Claims, 2 Drawing Sheets

(51) Int. Cl.
    *H01L 23/522*     (2006.01)
    *H01L 33/38*     (2010.01)
    *H01L 23/482*     (2006.01)
    *H01L 23/532*     (2006.01)

(52) U.S. Cl.
    CPC .... *H01L 23/5226* (2013.01); *H01L 23/53228* (2013.01); *H01L 27/1262* (2013.01); *H01L 33/382* (2013.01); *H01L 33/387* (2013.01)

(56) References Cited

U.S. PATENT DOCUMENTS

| | | | | |
|---|---|---|---|---|
| 2015/0287683 | A1* | 10/2015 | Moon | H01L 23/3192 |
| | | | | 257/621 |
| 2016/0254285 | A1 | 9/2016 | Long et al. | |
| 2017/0213860 | A1* | 7/2017 | Ukigaya | H01L 27/14627 |
| 2018/0006058 | A1* | 1/2018 | Lee | H01L 27/1218 |
| 2019/0067398 | A1 | 2/2019 | Liu | |

FOREIGN PATENT DOCUMENTS

| | | | |
|---|---|---|---|
| CN | 107565049 A | 1/2018 | |
| CN | 108535928 A | 9/2018 | |

* cited by examiner

ARRAY SUBSTRATE AND MANUFACTURING METHOD THEREFOR, DISPLAY PANEL, AND DISPLAY DEVICE

CROSS-REFERENCE TO RELATED APPLICATION

This application claims priority of Chinese Patent Application No. 201811149702.0, filed on Sep. 29, 2018, which is hereby incorporated by reference in its entirety.

TECHNICAL FIELD

The present disclosure relates to the technical field of display, and in particular, to an array substrate and a manufacturing method therefor, a display panel, and a display device.

BACKGROUND

Through Glass Via (TGV) technique is a key technique for manufacturing three-dimensional integrated circuits. Normally, the TGV technique is to use laser to punch a via having a width of tens to hundreds of micrometers on glass of hundreds of micrometers thick, and then the via is filled with copper (Cu) to connect an electronic component.

SUMMARY

Some embodiments of the present disclosure provide an array substrate, including a base substrate, and a lead-out line and an inorganic insulating layer which are located on one side of the base substrate; the base substrate is provided with a plurality of connection vias penetrating the base substrate and filled with a first conductive material;

the inorganic insulating layer is provided with a first via and a second via, the first via penetrating the inorganic insulating layer to the first conductive material, and the second via penetrating the inorganic insulating layer to the lead-out line; and a second conductive layer is disposed on the side, away from the base substrate, of the first via, the second via and the inorganic insulating layer, such that the first conductive material and the lead-out line are electrically connected through the second conductive layer.

In a possible implementation manner, in the array substrate provided by some embodiments of the present disclosure, a thin film transistor is disposed on the base substrate and a signal line of the thin film transistor is electrically connected to the lead-out line.

In a possible implementation manner, in the array substrate provided by some embodiments of the present disclosure, the signal line includes a gate line and a data line, and the lead-out line is disposed in the same layer as the gate line or the data line.

In a possible implementation manner, in the array substrate provided by some embodiments of the present disclosure, the lead-out line is located in a bezel area, and the signal line is located in a display area.

In a possible implementation manner, in the array substrate provided by some embodiments of the present disclosure, the thin film transistor includes a gate insulating layer and a passivation layer, wherein the inorganic insulating layer includes the gate insulating layer and the passivation layer.

In a possible implementation manner, the array substrate provided by some embodiments of the present disclosure further includes a polarization layer on the side, away from the base substrate, of the thin film transistor, wherein the first via and the second via further penetrate the polarization layer.

In a possible implementation manner, the array substrate provided by some embodiments of the present disclosure further includes a micro LED located on the side, away from the base substrate, of the polarization layer; and the positive and negative electrodes of the micro LED are connected to the source and drain electrodes of the thin film transistor through a third conductive part.

In a possible implementation manner, in the array substrate provided by some embodiments of the present disclosure, the third conductive part is disposed in the same layer as the second conductive layer.

In a possible implementation manner, in the array substrate provided by some embodiments of the present disclosure, the thin film transistor is an oxide thin film transistor, an amorphous silicon thin film transistor, or a low temperature polycrystalline silicon thin film transistor.

In a possible implementation manner, in the array substrate provided by some embodiments of the present disclosure, the first conductive material is copper.

In a possible implementation manner, in the array substrate provided by some embodiments of the present disclosure, the material of the second conductive layer is silver/indium tin oxide/silver.

In a possible implementation manner, the array substrate provided by some embodiments of the present disclosure further includes a first insulating layer, a second insulating layer and an integrated circuit chip which are located on the other side of the base substrate;

the first insulating layer and the second insulating layer are provided with a third via penetrating through the two layers, and the third via corresponds to the connection vias; and a trace of the integrated circuit chip is electrically connected to the first conductive material through the third via.

Correspondingly, some embodiments of the present disclosure further provide a manufacturing method for the array substrate, including:

forming, on a base substrate, a plurality of connection vias penetrating the base substrate;

filling the connection vias with a first conductive material;

forming a lead-out line and an inorganic insulating layer on the base substrate provided with the connection vias;

forming a first via penetrating to the first conductive material in the inorganic insulating layer corresponding to the connection vias, and forming a second via penetrating to the lead-out line in the inorganic insulating layer corresponding to the lead-out line; and forming a second conductive layer on the side, away from the base substrate, of the first via, the second via and the inorganic insulating layer.

In a possible implementation manner, the manufacturing method provided by some embodiments of the present disclosure, prior to the step of forming a second conductive layer on the side, away from the base substrate, of the first via, the second via and the inorganic insulating layer, further includes:

performing H Plasma reduction on the first conductive material.

On the basis of the same inventive concept, some embodiments of the present disclosure further provide a display panel including the array substrate.

On the basis of the same inventive concept, some embodiments of the present disclosure further provide a display device including the display panel.

DETAILED DESCRIPTION

Figure 1:
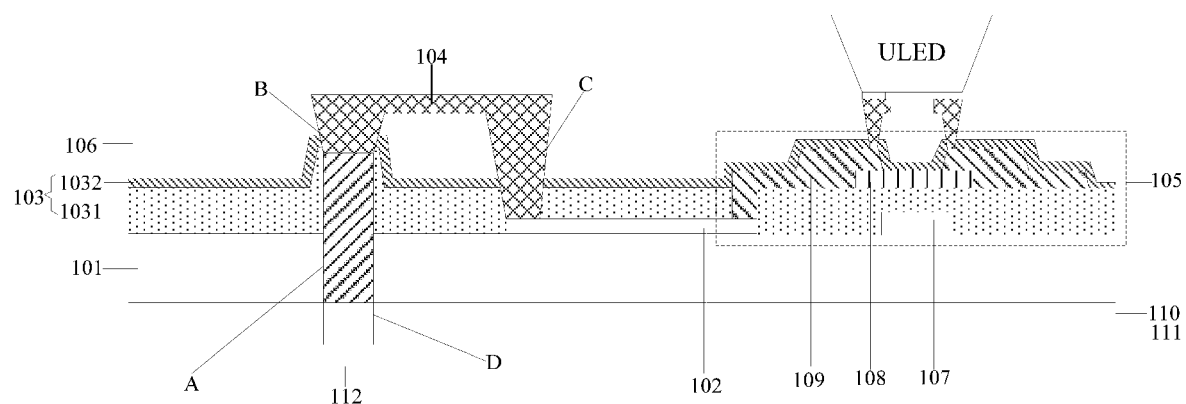
FIG. 1 is a structure schematic diagram of an array substrate provided by some embodiments of the present disclosure.

An array substrate and a manufacturing method therefor, a display panel, and a display device provided by embodiments of the present disclosure will be described in detail below with reference to the drawings. It should be noted that the embodiments described herein are merely part of embodiments of the present disclosure rather than all embodiments; in the case of no conflict, the embodiments in the present application and the features in the embodiments may be combined with each other; and furthermore, all other embodiments obtained by a person of ordinary skill in the art on the basis of the embodiments of the present disclosure without creative efforts fall within the protection scope of the present disclosure.

The shape and size of each film layer in the drawings does not reflect its true scale in the array substrate, and the purpose is only to illustrate the contents of the present disclosure.

When the TGV technique is applied to the manufacture of an array substrate, a signal line located on the front surface of a glass substrate and led out by a lead-out line, and a trace of an integrated circuit chip on the rear surface of the glass substrate may be connected through Cu in a via to achieve the effect of narrow bezel or no bezel. However, the high temperature process in the manufacturing process of the array substrate will cause the swelling of Cu in the via, which will lead to the rupture of the film layer, resulting in the poor disconnection between the signal line and the trace of the integrated circuit chip.

Therefore, in order to solve the technical problem of poor disconnection between the signal line and the trace of the integrated circuit chip caused by the swelling of Cu, some embodiments of the present disclosure provide an array substrate, as shown in FIG. 1, including a base substrate 101, and a lead-out line 102 and an inorganic insulating layer 103 which are located on one side of the base substrate 101; the base substrate 101 is provided with a plurality of connection vias A penetrating the base substrate 101 and filled with a first conductive material; and in practical applications, the first conductive material may be copper, molybdenum, titanium, tantalum, tungsten, chromium, aluminum, and other metals or metal alloys, which is not limited herein.

The inorganic insulating layer 103 is provided with a first via B and a second via C, the first via B penetrating the inorganic insulating layer 103 to the first conductive material, and the second via C penetrating the inorganic insulating layer 103 to the lead-out line 102.

A second conductive layer 104 is disposed on the side, away from the base substrate 101, of the first via B, the second via C and the inorganic insulating layer 103, such that the first conductive material and the lead-out line 102 are electrically connected through the second conductive layer 104; and optionally, the material of the second conductive layer 104 is Ag/ITO/Ag, and may of course be other conductive materials, which is not limited herein.

In the array substrate provided by some embodiments of the present disclosure, the lead-out line 102 is electrically connected to the first conductive material (such as copper) through the second conductive layer 104 by means of punching the first via B and the second via C after the high temperature process for manufacturing the lead-out line 102 and the inorganic insulating layer 103 is completed, thus effectively ensuring the connection between a signal line led out by the lead-out line 102 on the front surface of the base substrate 101 and a trace of an integrated circuit chip electrically connected to the first conductive material and located on the rear surface of the base substrate 101, and solving the problem of poor disconnection caused by swelling of the first conductive material such as copper.

In the array substrate provided by some embodiments of the present disclosure, as shown in FIG. 1, a thin film transistor 105 is further disposed on the array substrate 101 and a signal line of the thin film transistor 105 is electrically connected to the lead-out line 102. Optionally, the thin film transistor 105 may be an oxide thin film transistor, an amorphous silicon thin film transistor or a low temperature polycrystalline silicon thin film transistor, which is not limited herein. Furthermore, the thin film transistor 105 may be a top gate thin film transistor or a bottom gate thin film transistor, which is not limited herein.

Figure 2:
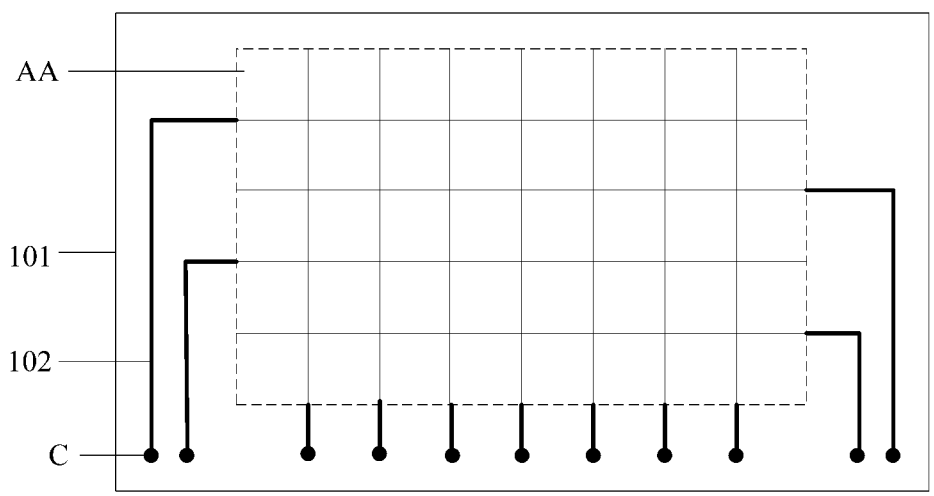
FIG. 2 is another structure schematic diagram of an array substrate provided by some embodiments of the present disclosure.

Optionally, in the array substrate provided by some embodiments of the present disclosure, the signal line may comprise a gate line and a data line, and the lead-out line 102 may be disposed in the same layer as the gate line, or may be disposed in the same layer as the data line. Furthermore, generally, as shown in FIG. 2, the signal line is located in a display area AA, and the lead-out line 102 is located in a bezel area around the display area AA. The gate line is disposed in the same layer as a gate 107, and the data line is disposed in the same layer as source and drain electrodes 109. FIG. 1 optionally shows that the lead-out line 102 is disposed in the same layer as the gate line (also the gate 107). In this case, the connection between the lead-out line 102 and the data line disposed in a different layer can be realized by means of punching, thus leading the data line out to the second via C through the lead-out line 102. The lead-out line 102 which is disposed in the same layer as the gate line and used for leading out the gate line can be equivalent to the part, extending from the boundary of the display area to the second via C of the bezel area, of the gate line, such that the lead-out line 102 leads the gate line out to the second via C. Similarly, when the lead-out line 102 is disposed in the same layer as the data line (also the source and drain electrodes 109), the connection between the lead-out line 102 and the gate line disposed in a different layer can be realized by means of punching, thus leading the gate line out to the second via C through the lead-out line 102. The lead-out line 102 which is disposed in the same layer as the data line and used for leading out the data line can be equivalent to the part, extending from the boundary of the display area to the second via C of the bezel area, of the data line, such that the lead-out line 102 leads the data line out to the second via C.

In the array substrate provided by some embodiments of the present disclosure, as shown in FIG. 1, generally, the thin film transistor 105 may include a gate insulating layer 1031, a passivation layer 1032 and an active layer 108. The inorganic insulating layer 103 may optionally include a gate insulating layer 1031 and a passivation layer 1032.

In a specific implementation, the array substrate provided by some embodiments of the present disclosure as shown in FIG. 1 may further include a polarization layer 106 on the side, away from the base substrate 101, of the thin film transistor 105, wherein the first via B and the second via C further penetrate the polarization layer 106.

The array substrate provided by some embodiments of the present disclosure as shown in FIG. 1 may further include but will not be limited to a micro LED located on the side, away from the base substrate 101, of the polarization layer 106. Every micro LED can be driven for emitting light separately like an OLED, except that the micro LED is made of an inorganic material. Therefore, the micro LED overcomes the shortcomings of screen burning and short lifespan of the OLED. Furthermore, the micro LED has the advantages of fast response time, high contrast ratio, high color saturation, ultra-high resolution, simple structure, light and thin bending, etc. The size of the micro LED is 10-100 μm.

In order to separately drive each micro LED for emitting light, the positive and negative electrodes of the micro LED and the source and drain electrodes 109 of the thin film transistor 105 may be connected through a third conductive part. Optionally, in order to simplify the manufacturing process, the third conductive part is disposed in the same layer as the second conductive layer 104, that is, the material of the third conductive part is the same as the material of the second conductive layer 104, and the third conductive part and the second conductive layer 104 may be simultaneously formed by one-time patterning process.

The array substrate provided by some embodiments of the present disclosure as shown in FIG. 1 may further include a first insulating layer 110, a second insulating layer 111 and an integrated circuit chip (not shown in the drawing) which are located on the other side of the base substrate 101.

The first insulating layer 110 and the second insulating layer 111 are provided with a third via D penetrating through the two layers (the first insulating layer 110 and the second insulating layer 111), and the third via D corresponds to the connection vias A; optionally, the third via D corresponds to the connection vias A, which means that the orthographic projection of the third via D on the base substrate 101 at least partially overlaps with the orthographic projection of the connection vias A on the base substrate 101.

The trace 112 of the integrated circuit chip is electrically connected to the first conductive material in the connection vias A through the third via D. Optionally, the third via D is filled with a conductive material of the same material as the trace 112 of the integrated circuit chip.

Figure 3:
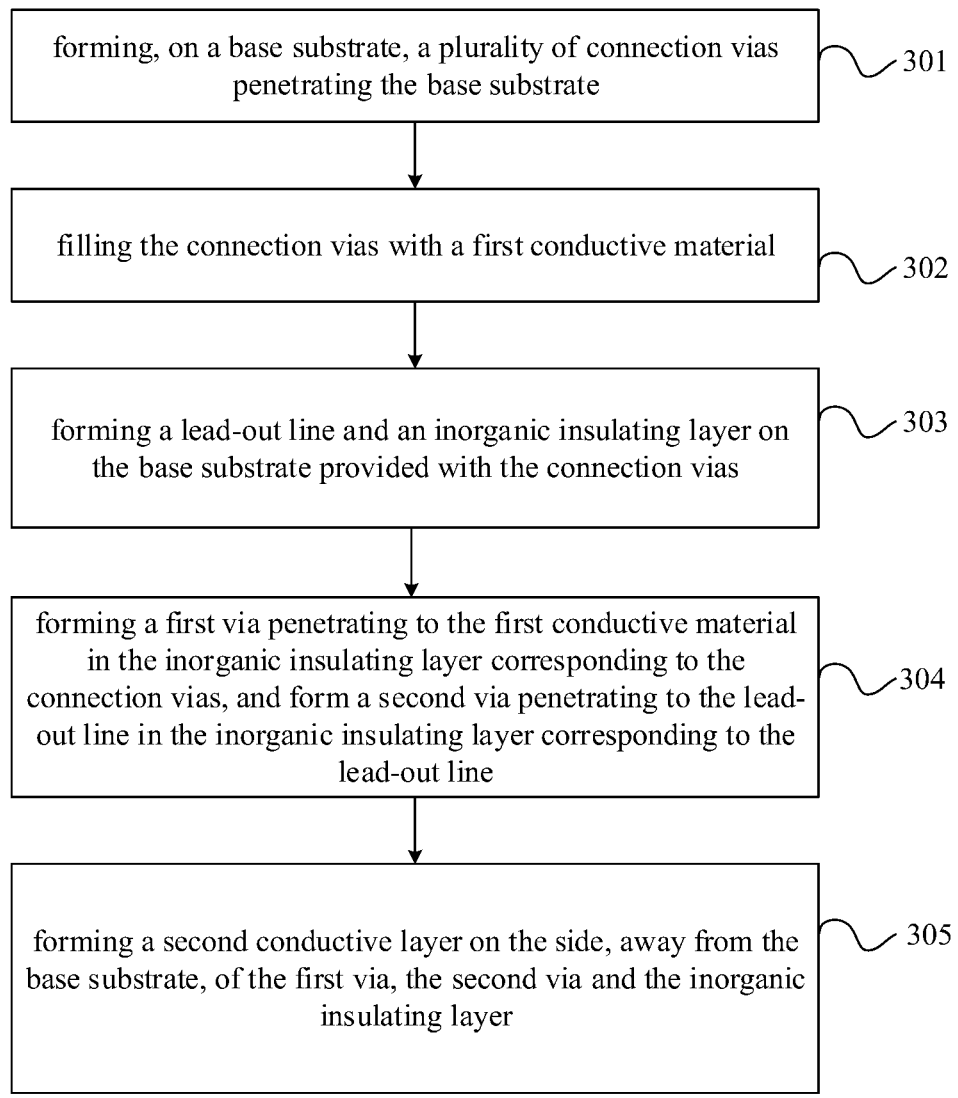
FIG. 3 is a flowchart of a manufacturing method for an array substrate provided by some embodiments of the present disclosure.

Correspondingly, regarding the array substrate provided by some embodiments of the present disclosure, some embodiments of the present disclosure further provide a manufacturing method, as shown in FIG. 3, including:

S301: forming, on a base substrate, a plurality of connection vias penetrating the base substrate;

S302: filling the connection vias with a first conductive material;

S303: forming a lead-out line and an inorganic insulating layer on the base substrate provided with the connection vias;

S304: forming a first via penetrating to the first conductive material in the inorganic insulating layer corresponding to the connection vias, and forming a second via penetrating to the lead-out line in the inorganic insulating layer corresponding to the lead-out line; and S305: forming a second conductive layer on the side, away from the base substrate, of the first via, the second via and the inorganic insulating layer.

In the manufacturing method provided by some embodiments of the present disclosure, prior to the step S305 of forming a second conductive layer on the side, away from the base substrate, of the first via, the second via and the inorganic insulating layer, the following step may be performed:

performing hydrion reduction on the first conductive material.

The manufacturing method provided by a present disclosure will be described in detail below with reference to a specific embodiment. The structure of the array substrate manufactured in this specific embodiment is as shown in FIG. 1.

In the first step, a plurality of connection vias A penetrating an base substrate 101 are formed on the base substrate 101, such as a glass substrate, by using the glass through hole (TGV) technique.

In the second step, a first conductive material such as copper is injected into the plurality of connection vias A.

In the third step, a gate 107 (including a gate line and a lead-out line 102), a gate insulating layer 1031, an active layer 108, source and drain electrodes 109 (including a data line), a passivation layer 1032 and a polarization layer 106 are sequentially patterned on one side (i.e., front surface) of the base substrate 101; wherein, the gate insulating layer 1031 and the passivation layer 1032 together constitute an inorganic insulating layer 103; the lead-out line 102 for leading out the gate line is located in an extending direction of the gate line, and the lead-out line 102 for leading out the data line is connected to the data line through a through via penetrating through the gate insulating layer 1031.

In the fourth step, a first via B penetrating a film layer above the swelling first conductive material is correspondingly formed in the area where the connection vias A are located; a second via C penetrating the gate insulating layer 1031, the passivation layer 1032 and the polarization layer 106 is correspondingly formed in the area where the other end of the lead-out line 102 is not connected to the gate line or the data line; and a through via penetrating through the passivation layer 1032 and the polarization layer 106 is correspondingly formed in the area where the source and drain electrodes 109 are located.

In the fifth step, the first conductive material exposed at the first via B is reduced by using hydrion.

In the sixth step, an Ag/ITO/Ag material layer (i.e., the second conductive layer 104) is formed on the side (optionally, the polarization layer 106), away from the base substrate 101, of the first via B, the second via C and the inorganic insulating layer 103, realizing electrical connection between the first conductive material and the lead-out line 102; and Ag/ITO/Ag (i.e., a third conductive part) is deposited in the through via corresponding to the area where the source and drain electrodes 109 are located.

In the seventh step, the positive and negative electrodes of the micro LED are respectively bonded to the source and drain electrodes 109 by Ag/ITO/Ag (i.e., the third conductive part).

In the eighth step, a first insulating layer 110 and a second insulating layer 111 are deposited on the other side (i.e., the rear surface) of the base substrate 101.

In the ninth step, a third via D penetrating the first insulating layer 110 and the second insulating layer 111 is formed on the first insulating layer 110 and the second insulating layer 111 corresponding to the area where the connection vias A are located by using the through silicon via (TSV) technique, wherein, the orthographic projection of the third via D on the base substrate 101 at least partially overlaps with the orthographic projection of the connection vias A on the base substrate 101.

In the tenth step, a trace 112 of the integrated circuit chip is patterned on a surface of the side, away from the first insulating layer 110, of the second insulating layer 111, and the integrated circuit chip is bonded to its trace. It can be understood that in the process of patterning the trace of the integrated circuit chip, the third via C will be filled with the same conductive material as the trace 112 of the integrated circuit chip.

So far, the array substrate shown in FIG. 1 has been manufactured.

It should be noted that in the manufacturing method provided by some embodiments of the present disclosure, the patterning process involved in forming each film layer structure may include not only some or all processes such as deposition, photoresist coating, mask masking, exposure, development, etching, photoresist stripping, but also other processes. The process, for example, may also include a post-baking process after development and prior to etching. The specific situation is based on the pattern, required by patterning, formed during the actual production process, which is not limited herein.

The deposition process may be a chemical vapor deposition method, a plasma enhanced chemical vapor deposition method or a physical vapor deposition method, which is not limited herein; the mask used in the masking process may be a Half Tone Mask, a Single Slit Mask or a Gray Tone Mask, which is not limited herein; and the etching may be dry etching or wet etching, which is not limited herein.

As can be seen from the above description, in the array substrate provided by some embodiments of the present disclosure, after film layers on the front surface of the base substrate 101 are manufactured, no more high temperature process will be used on the front surface subsequently. Furthermore, the electrical connection between the gate line and the data line and the trace 112 of the integrated circuit chip can be achieved by forming the first via B and the second via C in the inorganic insulating layer 103 and by forming the second conductive layer 104 on the first via B, the second via C and the inorganic insulating layer 103. Thus, the problem of poor disconnection caused by the swelling of the first conductive material such as copper is solved. Moreover, since the trace 112 of the integrated circuit chip is located on the rear surface of the base substrate 101, the number of front lines is reduced, and the technical effect of narrow bezel or no bezel is achieved.

On the basis of the same inventive concept, some embodiments of the present disclosure provide a display panel including the array substrate. The principle of the display panel to solve the problem is similar to that of the array substrate. Therefore, the implementation of the display panel provided by the embodiments of the present disclosure can be referred to the implementation of the array substrate provided by the embodiments of the present disclosure, and the repeated contents are not repeated herein.

On the basis of the same inventive concept, some embodiments of the present disclosure further provide a display device, including the display panel. The display device may be: a mobile phone, a tablet computer, a television, a display, a notebook computer, a digital camera, a navigator, a smart watch, a fitness wristband, a personal digital assistant, an automated teller machine, or any product or component with the display function. It should be understood by those of ordinary skill in the art that other essential components for a display device are all attached, which will not be repeated herein and should not be limited to the present disclosure. The implementation of the display device can be referred to the embodiments of the display panel, and the repeated contents are not repeated herein.

It should be noted that in this context, relationship terms such as first and second are merely used to distinguish one entity or operation from another entity or operation. Any actual relationship or order between entities or operations is not necessarily required or implied.

Obviously, a person skilled in the art can make various modifications and variations to the present disclosure without departing from the spirit and scope of the present disclosure. Thus, if these modifications and variations of the present disclosure fall within the scope of the claims of the present disclosure and the equivalent art, the present disclosure is also intended to include these modifications and variations.

The invention claimed is:

1. An array substrate, comprising a base substrate, and a lead-out line and an inorganic insulating layer which are located on one side of the base substrate; the base substrate being provided with a plurality of connection vias penetrating the base substrate and filled with a first conductive material; wherein,
   the inorganic insulating layer is provided with a first via and a second via, the first via penetrating the inorganic insulating layer to the first conductive material, and the second via penetrating the inorganic insulating layer to the lead-out line;
   a second conductive layer is disposed on the side, away from the base substrate, of the first via, the second via and the inorganic insulating layer, such that the first conductive material and the lead-out line are electrically connected through the second conductive layer;
   a thin film transistor is disposed on the array substrate and a signal line of the thin film transistor is electrically connected to the lead-out line; an orthographic projection of the thin film transistor on the base substrate does not overlap with the connection vias, and does not overlap with an orthographic projection of the second conductive layer on the base substrate.

2. The array substrate of claim 1, wherein the signal line comprises a gate line and a data line, and the lead-out line is disposed in a same layer as the gate line or the data line.

3. The array substrate of claim 1, wherein the lead-out line is located in a bezel area, and the signal line is located in a display area.

4. The array substrate of claim 1, wherein the thin film transistor comprises a gate insulating layer and a passivation layer, and the inorganic insulating layer comprises the gate insulating layer and the passivation layer.

5. The array substrate of claim 1, further comprising a polarization layer located on a side, away from the base substrate, of the thin film transistor, wherein the first via and the second via further penetrate the polarization layer.

6. The array substrate of claim 5, further comprising a micro LED located on a side, away from the base substrate, of the polarization layer; wherein
   positive and negative electrodes of the micro LED are connected to source and drain electrodes of the thin film transistor through a third conductive part.

7. The array substrate of claim 6, wherein the third conductive part is disposed in a same layer as the second conductive layer.

8. The array substrate of claim 1, wherein the thin film transistor is an oxide thin film transistor, an amorphous silicon thin film transistor, or a low temperature polycrystalline silicon thin film transistor.

9. The array substrate of claim 1, wherein the first conductive material is copper.

10. The array substrate of claim 1, wherein the material of the second conductive layer is silver/indium tin oxide/silver.

11. The array substrate of claim 1, further comprising a first insulating layer, a second insulating layer and an integrated circuit chip which are located on other side of the base substrate; wherein
- the first insulating layer and the second insulating layer are provided with a third via penetrating through both of the first insulating layer and the second insulating layer, and the third via corresponds to the connection vias; and
- a trace of the integrated circuit chip is electrically connected to the first conductive material through the third via.

12. A manufacturing method for an array substrate of claim 1, comprising:
- forming, on a base substrate, a plurality of connection vias penetrating the base substrate;
- filling the connection vias with a first conductive material;
- forming a lead-out line and an inorganic insulating layer on the base substrate provided with the connection vias;
- forming a first via penetrating to the first conductive material in the inorganic insulating layer corresponding to the connection vias, and forming a second via penetrating to the lead-out line in the inorganic insulating layer corresponding to the lead-out line; and
- forming a second conductive layer on the side, away from the base substrate, of the first via, the second via and the inorganic insulating layer.

13. The manufacturing method of claim 12, wherein prior to a step of forming a second conductive layer on the side, away from the base substrate, of the first via, the second via and the inorganic insulating layer, the manufacturing method further comprising:
- performing a hydrion reduction on the first conductive material.

14. A display panel, comprising an array substrate of claim 1.

15. A display device, comprising a display panel of claim 14.

* * * * *